(12) United States Patent
Willenberg et al.

(10) Patent No.: US 10,197,608 B2
(45) Date of Patent: Feb. 5, 2019

(54) APPARATUS FOR DETERMINING INSULATION RESISTANCE AT A PV GENERATOR, AND PHOTOVOLTAIC INSTALLATION

(71) Applicant: SMA SOLAR TECHNOLOGY AG, Niestetal (DE)

(72) Inventors: Mario Willenberg, Paderborn (DE); Dirk Hermeling, Petershagen (DE); Volker Bergs, Boeblingen (DE); Karl Nesemann, Kaufungen (DE)

(73) Assignee: SMA Solar Technology AG, Niestetal (DE)

( * ) Notice: Subject to any disclaimer, the term of this patent is extended or adjusted under 35 U.S.C. 154(b) by 0 days.

(21) Appl. No.: 15/680,623

(22) Filed: Aug. 18, 2017

(65) Prior Publication Data
US 2017/0343593 A1 Nov. 30, 2017

Related U.S. Application Data

(63) Continuation of application No. PCT/EP2016/050889, filed on Jan. 18, 2016.

(30) Foreign Application Priority Data

Feb. 18, 2015 (DE) .................. 10 2015 102 310

(51) Int. Cl.
*G01R 27/18* (2006.01)
*G01R 27/02* (2006.01)
(Continued)

(52) U.S. Cl.
CPC ........... *G01R 27/18* (2013.01); *G01R 27/025* (2013.01); *G01R 31/1263* (2013.01);
(Continued)

(58) Field of Classification Search
CPC ........ H02J 3/383; H02J 3/385; Y02E 10/563; Y02E 10/58; G01R 27/18; G01R 31/025; G01R 31/1263; H02S 40/32; H02S 50/00
See application file for complete search history.

(56) References Cited

U.S. PATENT DOCUMENTS

2012/0200960 A1* 8/2012 Mueller ............... G01R 15/146
361/20
2013/0121029 A1 5/2013 Coors et al.
(Continued)

FOREIGN PATENT DOCUMENTS

EP 0654673 A1 5/1995
WO 2014/079775 A1 5/2014

OTHER PUBLICATIONS

International Search Report dated Jun. 10, 2016 for International Application PCT/EP2016/050889.

*Primary Examiner* — Huy Q Phan
*Assistant Examiner* — Adam Clarke
(74) *Attorney, Agent, or Firm* — Eschweiler & Potashnik, LLC

(57) ABSTRACT

An apparatus for determining insulation resistance at a PV generator includes a first unit configured to shift a generator potential at an output terminal of the PV generator, and a second unit. The second unit is configured to determine the insulation resistance by: connecting a measurement voltage to the output terminal of the PV generator, measuring a first current value and a first voltage value at the output terminal of the PV generator before the measurement voltage is connected, measuring a second current value and a second voltage value at the output terminal of the PV generator after the measurement voltage is connected, and determining the insulation resistance of the PV generator based on the measured first and second current values and the measured
(Continued)

first and second voltage values. The first and second units are connected in series.

12 Claims, 3 Drawing Sheets

(51) Int. Cl.
*H02J 3/38* (2006.01)
*G01R 31/12* (2006.01)
*H02S 50/00* (2014.01)
*H02S 40/32* (2014.01)

(52) U.S. Cl.
CPC .............. *H02J 3/383* (2013.01); *H02S 50/00* (2013.01); *H02J 3/385* (2013.01); *H02S 40/32* (2014.12); *Y02E 10/563* (2013.01); *Y02E 10/58* (2013.01)

(56) References Cited

U.S. PATENT DOCUMENTS

| | | | |
|---|---|---|---|
| 2013/0221975 A1* | 8/2013 | Ward | G01R 31/025 324/509 |
| 2013/0328571 A1* | 12/2013 | Schepp | G01R 27/16 324/551 |
| 2014/0097854 A1 | 4/2014 | Hermeling et al. | |
| 2014/0306544 A1 | 10/2014 | Hantschel et al. | |
| 2014/0321166 A1 | 10/2014 | Coors et al. | |

* cited by examiner

APPARATUS FOR DETERMINING INSULATION RESISTANCE AT A PV GENERATOR, AND PHOTOVOLTAIC INSTALLATION

CROSS-REFERENCE TO RELATED APPLICATIONS

This application claims priority to PCT Patent Application Number PCT/EP2016/050889, filed on Jan. 18, 2016, which claims priority to German Patent Application Number DE 10 2015 102 310.5, filed on Feb. 18, 2015, which are hereby incorporated by reference in their entirety.

FIELD

The disclosure relates to an apparatus for determining insulation resistance at a photovoltaic generator, at the output terminal of which a device for shifting the electric potential with respect to ground is simultaneously connected, and to a photovoltaic installation having an apparatus of this kind.

BACKGROUND

Apparatuses for determining insulation resistance are required for safety reasons and are often integrated on the input side of a photovoltaic inverter in order to ensure insulation monitoring of the PV generator that is connected there. Apparatuses for determining insulation resistance are known, for example, from EP 0 654 673 B1, according to which, for each pulsed voltage value of the measurement voltage, the time profile of the transient response of the measurement current until a transient state is reached is monitored by supplying a plurality of pulsed AC voltages to the grid that is to be monitored. The measurement value difference of two consecutive measurement values is used to determine the insulation resistance between grid and ground.

If photovoltaic modules that are susceptible to degradation effects, for example PID (potential induced degradation) in the case of crystalline modules or TCO (transparent conductive oxide) corrosion in the case of thin-film modules, are connected to the photovoltaic inverter, devices for shifting the electric potential with respect to ground are connected in order to prevent said effects. Devices of this kind are well known; DE 20 2006 008 936 U1 from the applicant is mentioned as an example. This method is used particularly in large photovoltaic installations having an ungrounded PV generator and galvanic isolation from the grounded AC grid. The device for shifting the electric potential with respect to ground can in this case shift the negative pole or the positive pole of the PV generator to a defined potential with respect to ground, wherein the PV generator is typically shifted to such an extent that the entire PV generator (including the negative pole thereof) is positive with respect to ground potential. Within the context of the disclosure presented here, the term "shift" does not in any way imply a direction indication of the potential reference; here, it only means that the device for shifting the electric potential with respect to ground specifies a fixed, defined reference-ground potential, usually by means of a voltage source.

DE 10 2011 051 954 A1 describes an apparatus for a photovoltaic installation having a bias generation device for generating a bias at an inverter of the photovoltaic installation. The apparatus is intended to prevent TCO corrosion and polarization effects. DE 10 2011 055 220 A1 relates to a method for connecting a transformerless inverter in a solar power plant having an offset potential center point.

Problems arise when a device for shifting the electric potential with respect to ground at a PV generator is operated simultaneously in parallel with an apparatus for determining insulation resistance at a PV generator by means of an active method as described above. The device for shifting the electric potential with respect to ground maintains the potential of the PV generator with respect to ground, while the apparatus for determining insulation resistance attempts to shift the potential of the PV generator with respect to ground. Since for the most part the devices for shifting the electric potential have a higher efficiency than the apparatus for determining insulation resistance, the apparatus for determining insulation resistance is "overruled" and an excessively low, but at least distorted, insulation resistance value is measured.

For this reason, in practice, the device for shifting the electric potential with respect to ground at a PV generator is temporarily disconnected in order to determine the insulation resistance of said PV generator by means of the apparatus for determining insulation resistance at a PV generator. This means that the insulation resistance determination is not carried out continuously, but instead is carried out only at specific times. This state is unsatisfactory because, on the one hand, the PV generator should permanently be at the potential prescribed by the device for shifting the electric potential with respect to ground in order to prevent degradation effects, but it should also be possible to determine the insulation resistance at any time for safety reasons.

SUMMARY

There is a need for an apparatus for determining insulation resistance at a PV generator that operates permanently and at the same time as the shift in the electric potential with respect to ground and that enables precise specification of the insulation resistance of the PV generator.

In one embodiment an apparatus according to the disclosure for determining insulation resistance at a PV generator comprises a first unit for permanently shifting the generator potential at an output terminal of the PV generator and a second unit for determining insulation resistance. The second unit for determining insulation resistance switches a measurement voltage at the output terminal of the PV generator and measures a first current value and a first voltage value before the measurement voltage is connected and a second current value and a second voltage value after the measurement voltage is connected. The insulation resistance of the PV generator is determined taking into account the measured current and voltage values. In one embodiment the first and second unit of the apparatus according to the disclosure are connected in series. The order of the series connection is not important here.

In a refinement of the apparatus according to an embodiment of the disclosure, the first and second unit can be operated as separate devices. As a result of this, an existing system for shifting potential can be extended by a system for monitoring insulation or, conversely, a system for monitoring insulation can be supplemented by a system for shifting potential.

In a further refinement of the apparatus according to an embodiment of the disclosure, the first and second unit are integrated in one device, for example, the first and second unit are integrated into a photovoltaic inverter.

In a further refinement of the apparatus according to an embodiment of the disclosure, a third current value and a third voltage value are measured, in particular after the measurement voltage has been switched off. In one embodiment, the third current and voltage value are used to assess parameters that influence insulation resistance determination. In particular, parameters that can vary during the whole measurement period of the first to third current and voltage values and that can influence the determination of the insulation resistance are intended to be assessed.

A photovoltaic installation according to the disclosure has a PV generator, which is connected to a photovoltaic inverter by means of terminals, wherein an above-described apparatus for determining insulation resistance is connected to one of the terminals.

BRIEF DESCRIPTION OF THE DRAWINGS

The disclosure is described in more detail below on the basis of a plurality of exemplary embodiments with the aid of figures, in which.

DETAILED DESCRIPTION

The disclosure relates to an apparatus for determining insulation resistance at a photovoltaic generator, at the output terminal of which a device for shifting the electric potential with respect to ground is simultaneously connected, and to a photovoltaic installation having an apparatus of this kind. Photovoltaic generators are generally connected to photovoltaic inverters that convert the direct current generated by the photovoltaic generator (PV generator for short) into a grid-compliant alternating current. It is therefore particularly advantageous to integrate an apparatus according to the disclosure for determining insulation resistance into the connected photovoltaic inverter.

Figure 1:
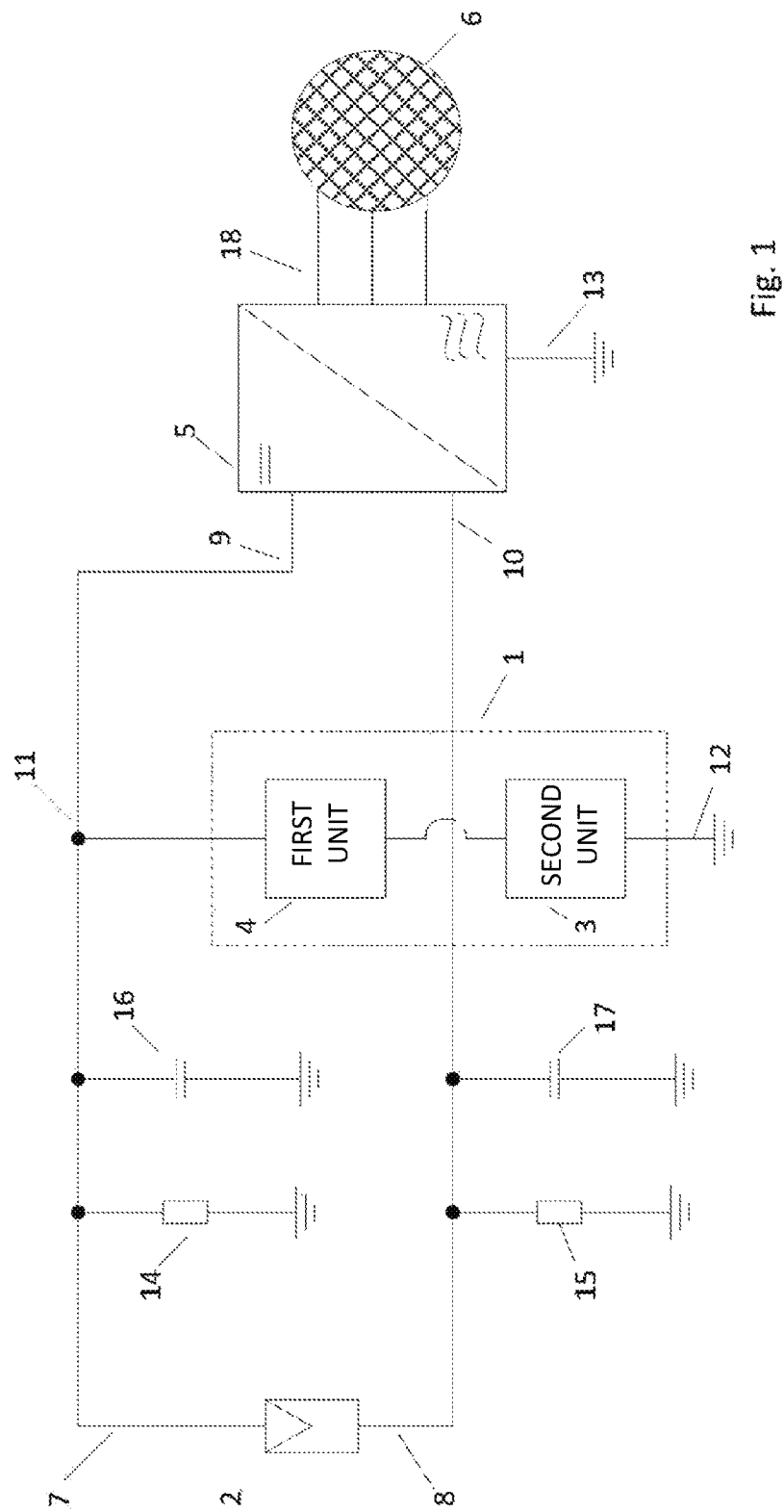
FIG. 1 shows a schematic representation of a system composed of a photovoltaic generator, inverter and apparatus according to the disclosure.

FIG. 1 shows, as exemplary embodiment, a photovoltaic installation 20 having a PV generator 2, which is connected by the terminals 7 and 8 thereof to the input terminals 9, 10 of a photovoltaic inverter 5. An apparatus 1 according to the disclosure for determining insulation resistance is connected at one of said terminal pairs to a terminal 11. A further terminal 12 is connected to ground. The photovoltaic inverter 5 is connected by the output terminals 18 thereof to a grid 6, which in this case may be a larger interconnected grid or else an island system. The photovoltaic inverter 5 may also supply local DC or AC loads (not shown) or feed power to the grid 6.

The apparatus 1 for determining insulation resistance comprises a first unit 3 and a second unit 4. The first unit 3 serves to protect against degradation effects. In this example the first unit shifts the positive pole of the PV generator 2 by a voltage value of 700 to 1000 V with respect to ground, in this case referred to below as an offset voltage. The first unit 3 may comprise a voltage source, which can compensate for a leakage current of the PV generator to ground that arises in normal operation, the leakage current usually being limited to a safe level, e.g. 30 to 100 mA. The voltage source may contain an appropriate current limitation means. In the case of a grid that is connected to the photovoltaic inverter 5 having a fixed reference to ground, either the photovoltaic inverter 5 has to be embodied in a potential-isolating manner or a transformer can be interconnected between the photovoltaic inverter 5 and the grid 6 so that the potential can be shifted.

The second unit 4 serves to determine the insulation resistance of the PV generator 2, wherein the insulation resistance is illustrated in the figure by the resistors 14 and 15. In the real PV generator, there are a multiplicity of distributed discharge resistors to ground, which can be assigned to the individual components of the PV generator 2 (PV modules, PV cables, etc.). As an equivalent circuit diagram, the discharge resistors can be illustrated equivalently by a first resistor 14 from the positive pole of the PV generator 2 to ground and by a second resistor 15 from the negative pole of the PV generator 2 to ground. Both resistors can be different sizes. The insulation resistance of the PV generator 2 corresponds to the parallel connection of both resistors illustrated in FIG. 1. The second unit 4 employs an active method to determine the insulation resistance, as is described in EP 0 654 673 B1, for example. For this purpose, a further voltage is immediately applied to the offset voltage that is generated by the first unit 3 and the profile of the voltage U at the terminal 11 to ground and the current I through the units 3 and 4 is measured.

Figure 2:
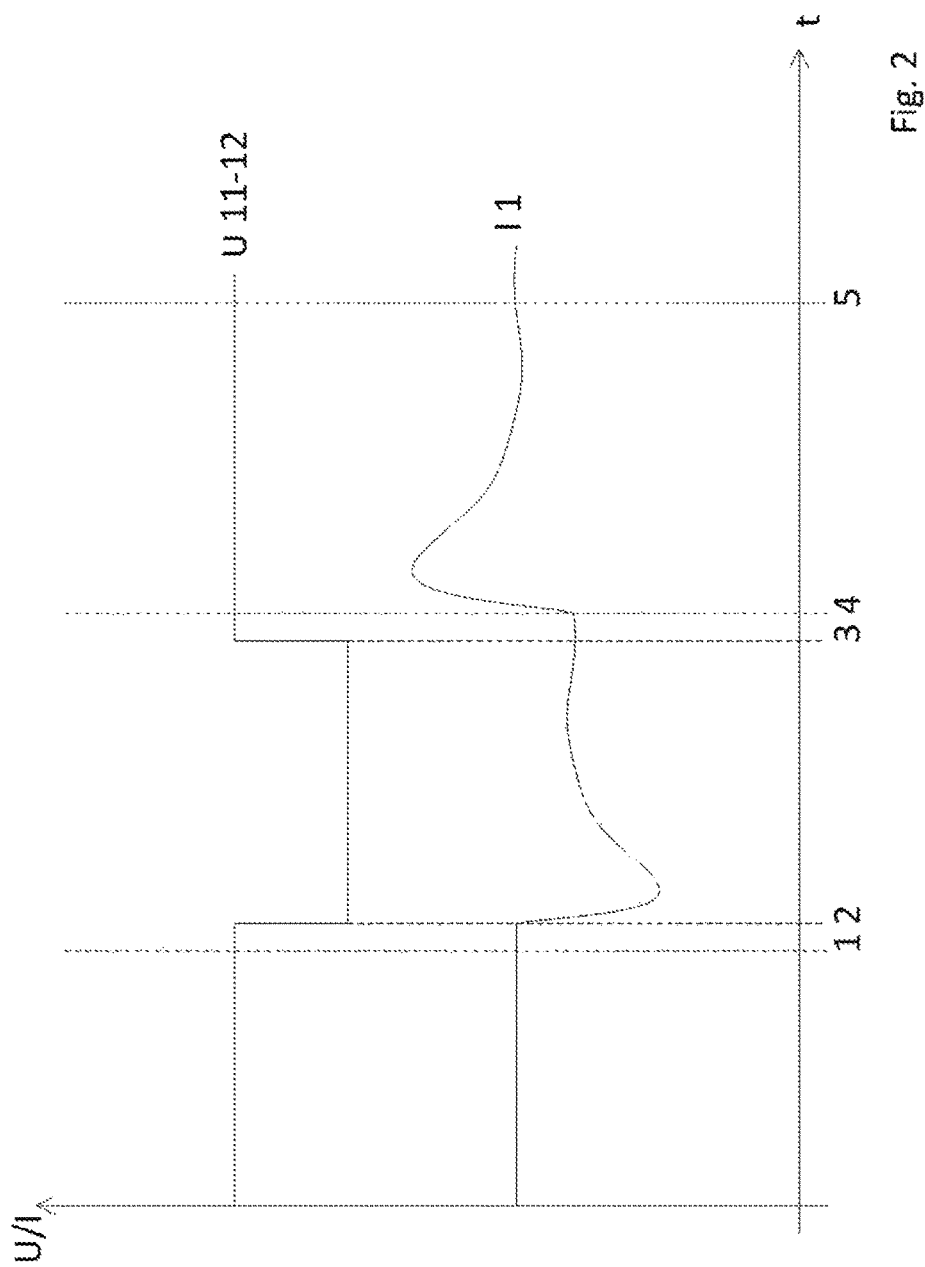
FIG. 2 shows a schematic representation of measurement value profiles.

FIG. 2 shows, by way of example, how the temporal current profiles I or voltage profiles U may look when a method as described above is employed. At the time $t_1$, current and voltage ($I_1$, $U_1$) are measured at or by the second unit 4. At the time $t_2$, a measurement voltage that is added to the offset voltage by the first unit 3 is connected. Since PV generators also act as capacitances due to their areal extent, the capacitances being symbolized in FIG. 1 by the capacitors 16, 17, the current profile after the measurement voltage has been connected is characterized by overshoots and a slow decay to a new rest state. After the decay phase, at time $t_3$, current and voltage ($I_3$, $U_3$) are measured again. At the time $t_4$, the measurement voltage is switched off again; and now the original offset voltage is applied again to the terminal 11.

In order to determine the insulation resistance $R_{ins}$ of the PV generator 2, the ratio of change in voltage to change in current of the determined measurement values is evaluated:

$$R_{ins} = \frac{U_1 - U_3}{I_1 - I_3}$$

This relationship is only valid on condition that, for example, the voltage at the PV generator 2 across the terminals 7 and 8 does not change between the times $t_1$ to $t_3$. In addition, the insulation resistance $R_{ins}$ itself must also remain constant during the period between the two measurement times. At the time $t_5$, a further measurement value pair ($I_5$, $U_5$) is determined, again after waiting for a "settling time", in order to assess whether the determined measurement values are suitable for precisely determining the insulation resistance $R_{ins}$. If $U_1$ is then equal to $U_5$ and $I_1$ is then equal to $I_5$, it can be assumed that the relevant conditions have not changed during the entire measurement duration, and the insulation resistance $R_{ins}$ can be deduced with sufficient accuracy from the above formula.

Figure 3:
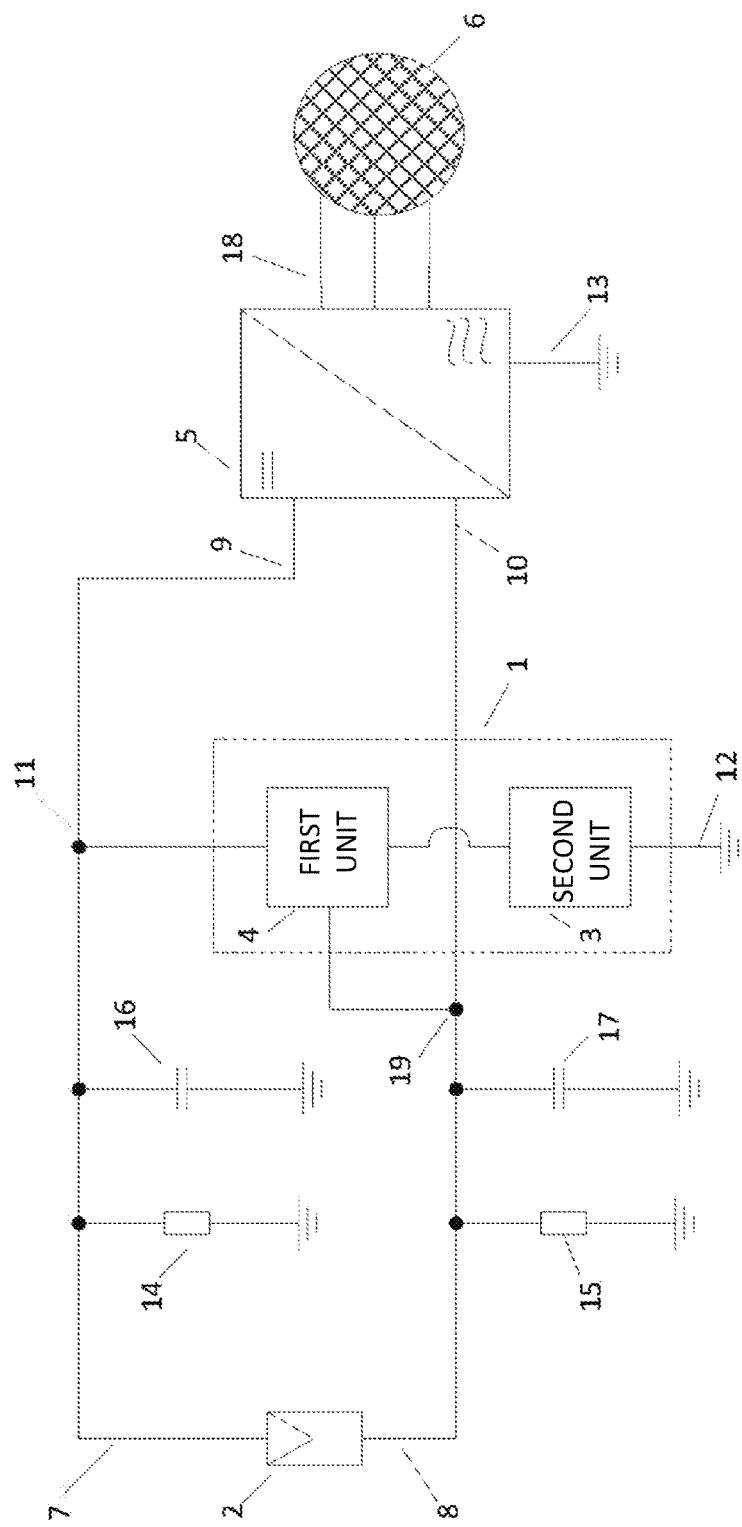
FIG. 3 shows a schematic representation of a system composed of a photovoltaic generator, inverter and apparatus according to the disclosure with additional voltage measurement.

Since it is possible for the voltage at the PV generator 2 to change (e.g. as a result of changes in irradiation or by MPP tracking of the PV inverter 5), it is advantageous to exclude the influence of errors on this voltage. FIG. 3 illustrates an advantageous refinement of the apparatus according to an embodiment of the disclosure that achieves this aim. In addition to the voltage between the terminal 11 to ground (hereinafter referred to as $U_p$), the second unit 4 in this case also measures the voltage between the terminal 19 to ground (hereinafter referred to as $U_n$). The insulation resistance can then be calculated as follows:

$$R_{ins} = \frac{U_p + k \times U_n}{I \times (k+1)}$$

Here, the factor k represents the ratio of the resistance values $R_{14}$, $R_{15}$ of the resistors 14 and 15 with respect to one another.

$$k = R\_14/R\_15$$

As can be seen in the calculation formula of the insulation resistance $R_{ins}$, the value can be calculated directly from the instantaneous measurement values $U_p$, $U_n$ and I, provided that a value is known for k.

The factor k can be determined by an active method by virtue of the fact that a further voltage that is generated by the second unit 4 is immediately applied to the offset voltage that is generated by the first unit 3 and the voltage profiles of the voltages $U_p$ and $U_n$ and the current through the units 3 and 4 is measured. Measurement value pairs ($U_{p1}$, $U_{n1}$, $I_1$) for time $t_1$ and ($U_{p3}$, $U_{n3}$, $I_3$) for time $t_3$ are therefore obtained in a similar way to as shown in FIG. 2. The factor k can therefore be determined as follows:

$$k = \frac{I_3 \times U_{p1} - I_1 \times U_{p3}}{I_1 \times U_{n3} - I_3 \times U_{n1}}$$

The parameter that cannot change during measurement times is the insulation resistance $R_{ins}$ itself. In order to be able to monitor the error influence, a third measurement time $t_5$ can be used in a similar way to as shown in FIG. 2. When the calculated insulation resistance values at measurement time $t_1$ and $t_5$ correspond, of the insulation resistance $R_{ins}$ can be deduced with sufficient accuracy.

The invention claimed is:

1. An apparatus for determining insulation resistance at a photovoltaic (PV) generator, comprising: a first unit configured to shift a generator potential at an output terminal of the PV generator, a second unit configured to determine the insulation resistance by: connecting a measurement voltage to the output terminal of the PV generator, measuring a first current value and a first voltage value at the output terminal of the PV generator before the measurement voltage is connected, measuring a second current value and a second voltage value at the output terminal of the PV generator after the measurement voltage is connected, and determining the insulation resistance of the PV generator based on the measured first and second current values and the measured first and second voltage values, wherein the first and second units are connected in series.

2. The apparatus as claimed in claim 1, wherein the first and second units are provided as separate devices.

3. The apparatus as claimed in claim 1, wherein the first and second units are integrated in one device.

4. The apparatus as claimed in claim 1, wherein the second unit is further configured to measure a third current value and a third voltage value after the measurement voltage has been switched off and use the third current and the third voltage when determining the insulation resistance.

5. The apparatus as claimed in claim 4, wherein the second unit is configured to use the third current value and the third voltage value in addition to an assessment of a variation of parameters that influence the insulation resistance determination during an entirety of a measurement period.

6. The apparatus as claimed in claim 3, wherein the first and second units are integrated into a photovoltaic inverter.

7. A photovoltaic (PV) installation, comprising: a PV generator, a photovoltaic inverter connected to the PV generator by means of terminals, an apparatus connected to one of the terminals, wherein the apparatus is configured to determine an insulation resistance associated with the PV generator, the apparatus comprising: a first unit configured to shift a generator potential at an output terminal of the PV generator, a second unit configured to determine the insulation resistance by: connecting a measurement voltage to the one of the terminals, measuring a first current value and a first voltage value at the one of the terminals before the measurement voltage is connected, measuring a second current value and a second voltage value at the one of the terminals after the measurement voltage is connected, and determining the insulation resistance of the PV generator based on the measured first and second current values and the measured first and second voltage values, wherein the first and second units are connected in series.

8. An insulation resistance determination system, comprising: a connection terminal configured to couple to a first Direct Current (DC) line that couples a photovoltaic (PV) generator output to an inverter circuit input, a first unit coupled to a reference potential, and configured to provide an offset voltage at the connection terminal, a second unit coupled to the first unit and to the connection terminal, wherein the second unit is configured to: measure a first voltage at the connection terminal and a first current conducting through the second unit at a first time instant, apply a measurement voltage to the connection terminal at a second time instant subsequent to the first time instant, measure a second voltage at the connection terminal and a second current conducting through the second unit at a third time instant subsequent to the second time instant, determine an insulation resistance of the PV generator when coupled between the first DC line and a second DC line based on the first and second voltages and the first and second currents.

9. The system of claim 8, wherein a time period between the second time instant and the third time instant is long enough to ensure a settling of a voltage at the connection terminal that overshoots upon the application of the measurement voltage at the second time instant, the overshoot being due to a capacitance of the PV generator when coupled to the DC line.

10. The system of claim 8, wherein the second unit is further configured to:
remove the measurement voltage from the connection terminal at a fourth time instant subsequent to the third time instant,
measure a third voltage at the connection terminal and a third current conducting through the second unit at a fifth time instant subsequent to the fourth time instant, and
verify whether the insulating resistance determination is valid based on the first and third voltages and the first and third currents.

11. The system of claim 8, wherein the second unit is coupled to the second DC line that couples the PV generator to the inverter circuit, and wherein the second unit is further configured to:
- measure a complementary first voltage and a complementary second voltage at the second DC line at the first and third time instants, respectively, and
- use the complementary first and second voltages with the first and second voltages and the first and second currents in determining the insulation resistance of the PV generator when coupled between the first and second DC lines.

12. The system of claim 8, wherein the first unit and the second unit are connected together in series between the connection terminal and a reference potential.

* * * * *